United States Patent [19]

Scheu et al.

[11] 4,024,835
[45] May 24, 1977

[54] SPINNER CHUCK FOR NON-CIRCULAR SUBSTRATES

[75] Inventors: Friedrich Scheu, San Jose; Glenn W. Weberg, Saratoga, both of Calif.

[73] Assignee: Hewlett-Packard Company, Palo Alto, Calif.

[22] Filed: Oct. 6, 1975

[21] Appl. No.: 619,762

[52] U.S. Cl. .................................. 118/52; 269/21
[51] Int. Cl.² ..................................... B05C 11/12
[58] Field of Search .................. 118/52, 53, 54, 56; 269/21; 279/3; 427/240; 34/8, 58 51/1NQ

[56] References Cited

UNITED STATES PATENTS

| | | | |
|---|---|---|---|
| 1,811,395 | 6/1931 | Hoxie et al. | 118/52 X |
| 2,398,959 | 4/1946 | Petry | 279/3 |
| 2,833,680 | 5/1958 | Kneeling | 118/52 X |
| 3,389,682 | 6/1968 | Gardner | 118/52 |
| 3,577,267 | 5/1971 | Preston, Jr. et al. | 427/240 X |

FOREIGN PATENTS OR APPLICATIONS 62,463  5/1940  Norway .................................. 279/3

*Primary Examiner*—Morris Kaplan
*Attorney, Agent, or Firm*—David A. Boone; Robert S. Hulse

[57] ABSTRACT

A spinner chuck having a recessed portion for receiving non-circular substrates is used to alleviate uneven build-up of photoresist coatings applied on the substrate. Openings are disposed in the base of the recess about the periphery thereof whereby to drain off coating material spun off into the volume between the substrate and chuck sidewall defining said recess.

2 Claims, 4 Drawing Figures

SPINNER CHUCK FOR NON-CIRCULAR SUBSTRATES

BACKGROUND AND SUMMARY OF THE INVENTION

Generally, spinners are used to apply coatings of photosensitive material, commonly called photoresist, to substrates in semiconductor processes. This photoresist material is exposed to a selected pattern of ultraviolet light to control which areas will or will not be exposed during a subsequent step in the process.

Most integrated circuit processes use circular wafers for substrates and fabricate a few hundred chips on each wafer. After fabrication the wafer is diced and the individual circuits are separated.

Some applications have arisen wherein non-circular, generally oblong shaped, substrates of relatively large dimensions are employed to fabricate a particular device, for example, a thermal print head. In these applications it is particularly important to achieve uniform coverage of the substrate. Non-uniform coverage of the photoresist results in different areas of the device having different operating characteristics. For example, if one portion of a thermal print head operated at a higher temperature, a printout having an irregular appearance might be produced.

Previously, non-circular substrates have been held on top of circular spinner chucks by applied vacuum. This is the technique used for circular substrates. However, when using non-circular substrates, the aerodynamic properties of this structure, shown in FIG. 1, results in a build-up of coating material on the substrate as shown in FIG. 2.

In accordance with the preferred embodiment of the present invention, a recessed area for receiving the substrate is provided in a circular spinner chuck to alleviate the undesirable effects of the aerodynamic properties of a non-circular substrate.

DESCRIPTION OF THE PREFERRED EMBODIMENT

Figure 1:
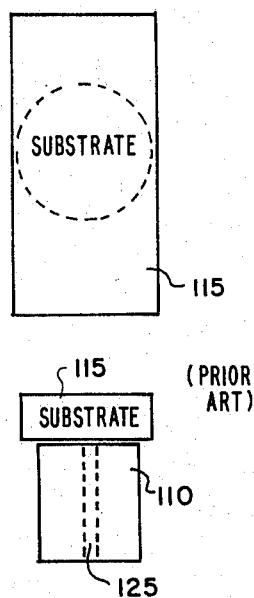
FIG. 1 shows a prior art spinner chuck with an oblong substrate mounted thereon.
Figure 2:
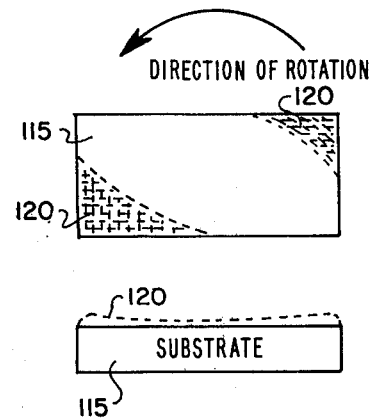
FIG. 2 shows a typical pattern of resist build-up when prior art techniques are used.

Referring to FIG. 1, there is shown a prior art spinner chuck 110 having a substrate 115 mounted thereon. Substrate 115 is held upon the spinner chuck by vacuum applied through an opening 125. When a few drops of resist are applied and the substrate and chuck are spun, the aerodynamic properties of the spinning substrate create an uneven resist coating 120 on the leading edges of substrate 115.

Figure 3A:
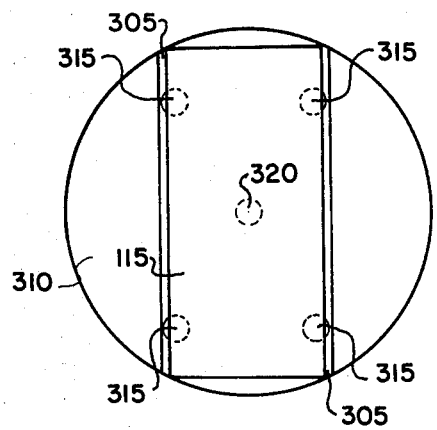
FIGS. 3A and 3B show a plan view and side elevation of a spinner chuck constructed in accordance with the preferred embodiment of the present invention.
Figure 3B:
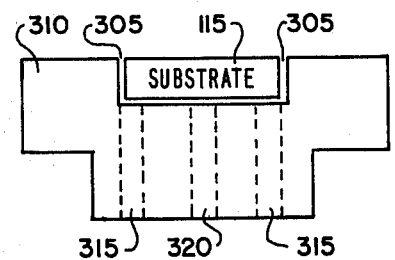

Referring now to FIG. 3, there is shown a spinner chuck constructed in accordance with the preferred embodiment. A recessed area 305 is formed in spinner chuck 310 for receiving substrate 115. The depth of the recessed portion is approximately equal to the thickness of substrate 115, thereby providing an essentially flat surface.

Excess resist applied to substrate 115 is spun over the top of spinner chuck 310. Some resist flows into the gap between spinner chuck 310 and substrate 115. If desired, resist drainage holes 315 may be provided to prevent build-up of resist material in the gap between substrate 115 and spinner chuck 315.

We claim:
1. A spinner chuck for holding a substrate material of predetermined thickness while the substrate is spun to distribute a coating material applied to its top surface, said spinner chuck comprising:
    a base portion; and
    an upper portion coupled to the base portion and having a flat surface on the top thereof, said flat surface having a recessed area for receiving and holding by vacuum the substrate material, the base of the recess having a plurality of openings spaced about the periphery thereof, means for establishing a vacuum pull through said openings, the depth of the recessed area being substantially equal to the thickness of the substrate material and greater in cross-sectional area than that of the substrate whereby coating material spinning off into the volume between the substrate and the sidewall defining the recess is drained off through said openings for producing uniform distribution of the applied coating material over the top surface of the substrate.

2. The spinner chuck in claim 1 wherein the flat surface is of a circular shape.

* * * * *